United States Patent
Viswanathan et al.

(10) Patent No.: US 7,425,911 B2
(45) Date of Patent: Sep. 16, 2008

(54) SIGNAL-TO-NOISE RATIO WHEN USING FEWER BITS THAN THE NUMBER OF OUTPUT BITS OF AN ANALOG TO DIGITAL CONVERTER

(75) Inventors: Nagarajan Viswanathan, Bangalore (IN); Jagannathan Venkataraman, Bangalore (IN); Ganesh Kiran, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/836,163

(22) Filed: Aug. 9, 2007

(65) Prior Publication Data

US 2008/0036632 A1 Feb. 14, 2008

Related U.S. Application Data

(60) Provisional application No. 60/821,968, filed on Aug. 10, 2006.

(51) Int. Cl.
*H03M 3/00* (2006.01)
(52) U.S. Cl. .................. 341/143; 341/118; 341/120; 341/131; 341/144; 341/155
(58) Field of Classification Search .................. 341/118, 341/120, 131, 143, 144, 155
See application file for complete search history.

(56) References Cited

U.S. PATENT DOCUMENTS

| | | | |
|---|---|---|---|
| 5,493,296 A * | 2/1996 | Sugihara | 371/76 |
| 6,232,899 B1 * | 5/2001 | Craven | 341/126 |
| 6,275,177 B1 * | 8/2001 | Ho et al. | 341/143 |
| 6,323,794 B1 * | 11/2001 | Okuda et al. | 341/143 |
| 6,326,912 B1 * | 12/2001 | Fujimori | 341/143 |
| 6,507,302 B2 * | 1/2003 | Sakimura | 341/143 |
| 6,522,276 B2 * | 2/2003 | Andre et al. | 341/143 |
| 6,839,010 B1 * | 1/2005 | Tsyrganovich | 341/143 |
| 6,967,608 B1 * | 11/2005 | Maloberti et al. | 341/143 |
| 7,245,246 B2 * | 7/2007 | Ihs et al. | 341/143 |
| 2004/0036634 A1 * | 2/2004 | Level et al. | 341/77 |
| 2007/0205934 A1 * | 9/2007 | Buisson | 341/155 |

OTHER PUBLICATIONS

R.J. Baker, J. Candy, G. Temes, S. Norsworthy, R. Schreier, G. Temes, Mingliang Liu, R. Schreier, G. Temes, V. Peluso, M. Steyaert, W. Sansen; Delta-sigma modulation—Wikipedia, the free encyclopedia, "http://en.wikipedia.org/wiki/Delta-sigma_modulation", pp. 01-06, Downloaded on Jul. 27, 2007, Wikimedia Foundation, Inc., a us-registered 501(c)(3).

* cited by examiner

*Primary Examiner*—Linh V Nguyen
(74) *Attorney, Agent, or Firm*—Wade J. Brady, III; Frederick J. Telecky, Jr.

(57) ABSTRACT

Improving signal-to-noise ratio (SNR) when using fewer bits than the number of output bits of an ADC as digital representation of the strength of the samples of an input signal. In an embodiment, an ADC generates digital values of H bits by sampling an input signal at corresponding time instances. An error signal representing the (H-N) least significant bits of the H-bit digital values is processed to determine respective filtered values, which are respectively added to the corresponding ones of the H-bit digital values. The (H-N) bits of the resulting added values are dropped to generate N bit values. The N bit values thus generated may have improved SNR at least in a band of interest, as desired.

20 Claims, 4 Drawing Sheets

SIGNAL-TO-NOISE RATIO WHEN USING FEWER BITS THAN THE NUMBER OF OUTPUT BITS OF AN ANALOG TO DIGITAL CONVERTER

RELATED APPLICATION

The present application claims priority from the following co-pending U.S. provisional patent application Ser. No. 60/821,968, entitled, "Noise Shaping to reduce quantization noise in Pipeline ADC", filed on: Aug. 10, 2006, naming as inventors: Viswanathan et al, which is incorporated in its entirety into the present application:

BACKGROUND

1. Field of the Invention

The present invention relates generally to ADCs (analog to digital converter), and more specifically to techniques for improving signal-to-noise ratio (SNR) when using fewer bits than the number of output bits of an ADC as digital representation of a strength of an input signal.

2. Related Art

Analog to digital converters (ADCs) are used to generate a sequence of digital codes representing the strength of an input signal at corresponding time instances, and may be implemented in various forms such as successive approximation (SAR) ADC, pipelined ADC, etc., as is well known in the relevant arts.

Signal-to-Noise Ratio (SNR) is generally a measure of the accuracy with which the digital codes represent the strength of the corresponding sample of the input signal, and is typically measured as a ratio of the strength of the input signal as represented by a corresponding digital code to the strength of noise components (due to various error sources) represented by the digital code. It is generally desirable that the SNR of a ADC be high such that the digital values accurately represent the input analog signal.

One source of noise in the output of an ADC is quantization noise, which results from mapping an input signal strength to one of finite digital codes, and is proportional to the value of the (signal strength represented by) least significant bit (LSB) of the output digital code. SNR is generally given by the relation (6.02*H+1.76) decibels (dB), where H is the number of output bits in the digital code (assuming a linear relationship between the output codes and the input signal). Each digital code generated by an ADC may contain multiple output bits. In general, using more number of output bits (H) for a digital code results in a larger (better) value of SNR.

However, there may exist scenarios where it may be desirable to represent each digital code using a number of bits fewer than the number of output bits (H, in the description above) of an ADC. For example, when the digital codes generated by an ADC need to be transmitted, it may be desirable to use a fewer number of bits for the digital codes due to bandwidth limitations of the path on which the codes need to be transmitted. Accordingly, each digital code may be represented by a fewer number of bits to fit within the bandwidth constraints.

As another example, there are often government restrictions, which prohibit vendors from selling 'ADCs' providing digital codes with more bits than a pre-specified number (e.g., 11 bits). However, at least for economies of scale, a vendor may use internal ADCs operating with higher number of output bits (e.g., 15), but externally limit the number of bits in each digital code to the pre-specified number (11).

Using a fewer number of bits, however, results in a reduced SNR, at least for reasons noted above. Therefore, it may be desirable to improve the SNR when using fewer bits than the number of output bits of an analog to digital converter.

BRIEF DESCRIPTION OF THE DRAWINGS

The present invention will be described with reference to the following accompanying drawings, which are described briefly below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

Overview

An analog-to-digital converter (ADC) (conveniently referred to as a "low resolution ADC") provided according to an aspect of the present invention includes a higher resolution ADC to sample an input signal at multiple time instances to generate corresponding H-bit samples. A processing block processes the H-bit samples to generate N-bit samples, with some N-bit samples having values greater than the corresponding H-bit samples and some other N-bit samples having values less than the corresponding H-bit samples. The SNR of the low resolution ADC may be enhanced as a result.

In an embodiment, the processing block contains a filter, which shifts one or more frequency components of an error signal (representing the (H-N) least significant bits of the H-bit samples) to be shifted to frequencies lying outside a desired band of interest.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

2. Analog-to-Digital Converter (ADC)

Figure 1:
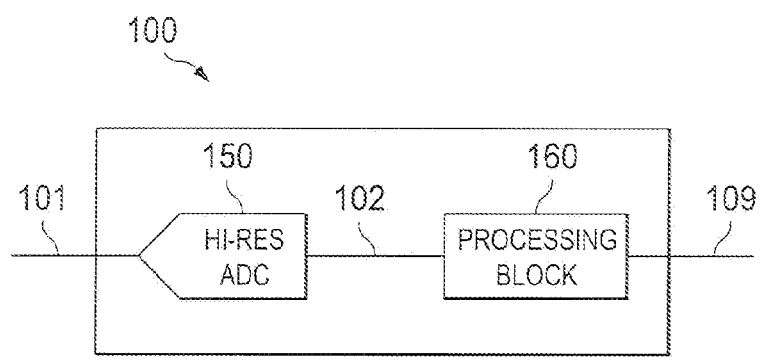
FIG. 1 is a block diagram illustrating the details of an example ADC provided according to an aspect of the present invention.

FIG. 1 is a block diagram of an ADC in an embodiment of the present invention. It should be appreciated that ADC 100 is referred to as 'low resolution ADC' to differentiate from higher resolution ADC 150. Thus, low resolution ADC 100 is shown containing high-resolution (hi-res) ADC 150 and processing block 160. Each component is described below in detail.

Hi-res ADC 150 receives an input signal on path 101, and operates to provide on path 102 digital codes (M-bits wide each) representing a strength of the input signal at corresponding time instances. The signal at each of the time instances (from which a corresponding digital code is generated) is referred to as a sample. Hi-res ADC 150 may be implemented using any of well known techniques such as successive approximation register (SAR) ADC, pipelined ADC etc.

Processing block 160 receives an M-bit digital code (high resolution code) on path 102 and operates to provide on path 109 an N-bit digital code (with N being less than M) to represent the input signal sample using a fewer number of bits (N), but with improved SNR than otherwise possible (by simply dropping the (M-N) least significant bits).

The manner in which processing block 160 operates to represent an input signal sample using a fewer number of bits in the output codes, but with improved SNR, may be better understood from a brief description of the effects of using a fewer number of bits on noise in an ADC, provided next.

3. Noise Floor

Figure 2A:
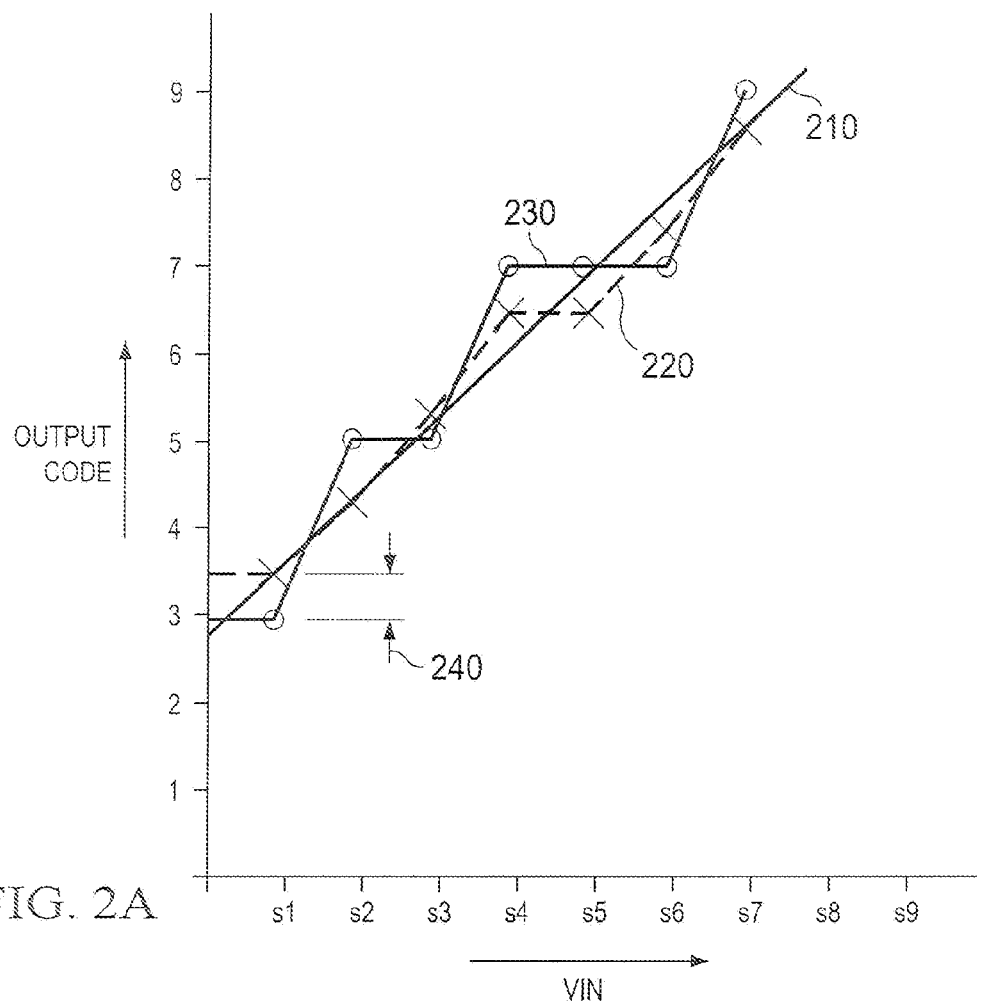
FIG. 2A is a graph illustrating the effect of using different number of bits to represent the same samples of an input signal.

FIG. 2A is an example diagram showing the output codes generated by hi-res ADC 150 for various signal strength samples of an input signal represented by waveform 210. The signals are not to scale, but illustrate the concepts sought to be demonstrated. The X-axis represents the strength of the input signal (Vin, assuming voltage is being converted), and Y-axis represents the output codes. It should be appreciated that all the discrete values shown on Y-axis are available for higher resolution (more output bits), but only alternative values are available for lower resolution (assuming one bit less than in the higher resolution ADC).

Waveform 220 represents the output codes generated when more number of bits are used, while waveform 230 represents the output codes when a fewer number of bits (one bit less when compared to waveform 220 in this example) are used. The value of the signal strength represented by a difference (e.g., value 240) between two corresponding output codes, one each on waveform 220 and 230 may be termed as an error signal.

Figure 2B:
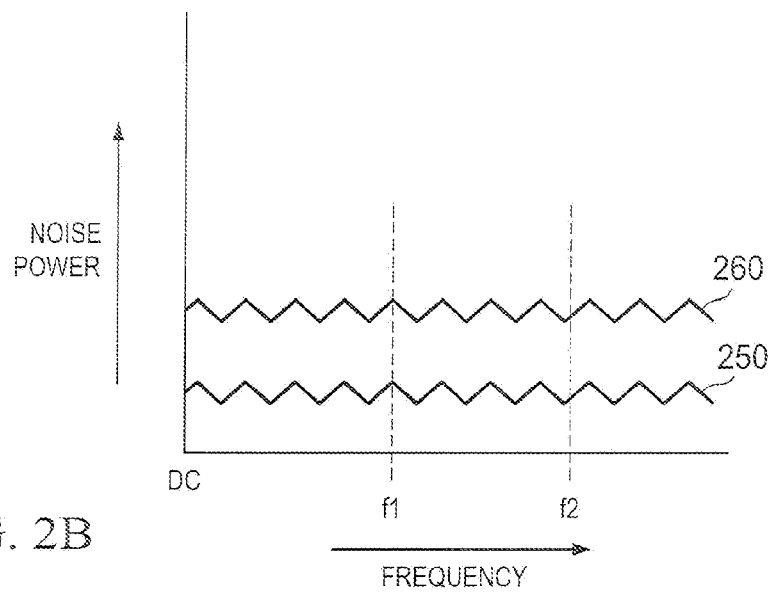
FIG. 2B is a graph illustrating the different noise floors resulting from using different number of bits to represent the same samples of an input signal.

It may be observed that waveform 220 (using more bits/higher resolution) approximates the input signal 210 more accurately. In general, as noted above, using a fewer number of bits to represent the output codes increases the quantization error of the ADC output codes, as illustrated in FIG. 2B.

Waveforms 250 and 260 (FIG. 2B) respectively represent the strength of noise components (noise floor) as a function of frequency for each of waveforms 220 and 230 of FIG. 2A. It may be observed that for a same input signal strength signal, using a fewer number of bits (as in the case of waveform 230) results in a noise floor (noise power) of larger strength. Consequently, the SNR corresponding to waveform 230 is lower than that for waveform 220.

Several aspects of the present invention improve SNR in a band of interest (represented by the frequency band from f1 to f2 in FIG. 2B) when a fewer number of bits are used for output codes of an ADC. An illustrative example is provided next with respect to FIG. 3.

4. Example

Figure 3:
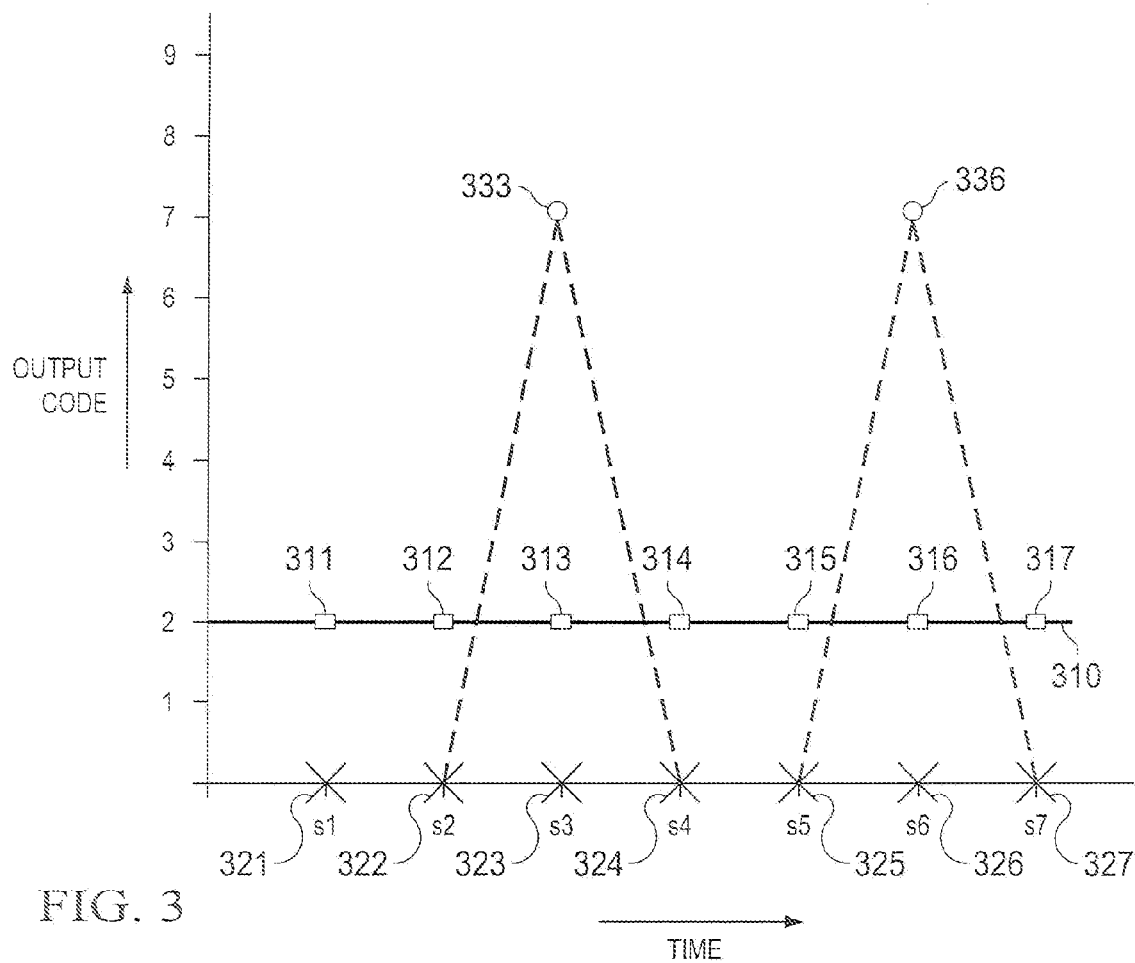
FIG. 3 is a graph illustrating the manner in which signal-to-noise ratio is enhanced in an embodiment of the present invention.

FIG. 3 is shown containing three waveforms. Waveform 310 represents a DC (zero frequency) input signal provided to ADC 100 of FIG. 1. A DC input signal is shown merely for ease of understanding. However, the features are applicable to any signal (having changing strength characterized by more frequency components)

The X-axis represents the strength of the input signal plotted against time. Points s1-s7 represent sampling instances at which digital codes of representing the input signal 310 are generated. The Y-axis represents the output codes. It is assumed in the following description that digital codes with three bits fewer than the number of output bits of ADC 100 are to be provided.

Input signal 310 is shown as being of constant strength (corresponding to 2V). Assuming ADC 100 contains six output bits to represent input signal 310, digital codes generated (on path 102 in FIG. 1) at each sampling instance s1-s7 would have a value of 000010 (binary 2 corresponding to the strength of input signal 2V) as represented by codes 311-317.

However, since the digital codes are to be provided with three bits less than the number of output bits of ADC 100 (i.e., digital codes to be provided are to contain only 3 bits), each of codes 311-317 may be truncated by ignoring (dropping) the lowest three bits. As a result, the output codes would each have a value of 0, as shown by output codes 321-327.

It may be observed that the noise due to this 'quantization' process (of dropping the 3 lower order bits) has a constant (DC) value of two.

According to an aspect of the present invention, some of the lower resolution (i.e., truncated) output digital codes are provided with a value greater than the corresponding higher resolution code, while some other output digital codes are provided with a value less than the corresponding higher resolution code.

Thus, some output codes (for example, codes 333 and 336 at sampling instances s3 and s6 respectively) may be provided (on path 109) with a value 111 (binary 7) which is greater than the corresponding higher resolution codes 313 and 316 which have a value of 000010 (binary 2). Other output codes (for example, codes 321, 322, 324, 325 and 327 at sampling instances s1, s2, s4, s5 and s7 respectively) may be provided (on path 109) with a value 000 (binary 0) which is less than the corresponding higher resolution codes 311, 312, 314, 315 and 317 which have a value of 000010 (binary 2).

It may be appreciated from the description above, that the quantization noise corresponding to an error due to the reduction in the number of output bits now contains a DC component as well as components at frequencies greater than zero. Thus, a portion of the noise has been shifted to a frequency greater than zero. Assuming that the band of interest is DC, the noise at DC is therefore less, resulting in a higher SNR.

In general, it may be desirable that processing block 160 filter the quantization noise in a band of interest to shift at least a portion of the noise to frequencies outside the band of interest. An aspect of the present invention provides for such a feature, as described next.

5. Processing Block

Figure 4:
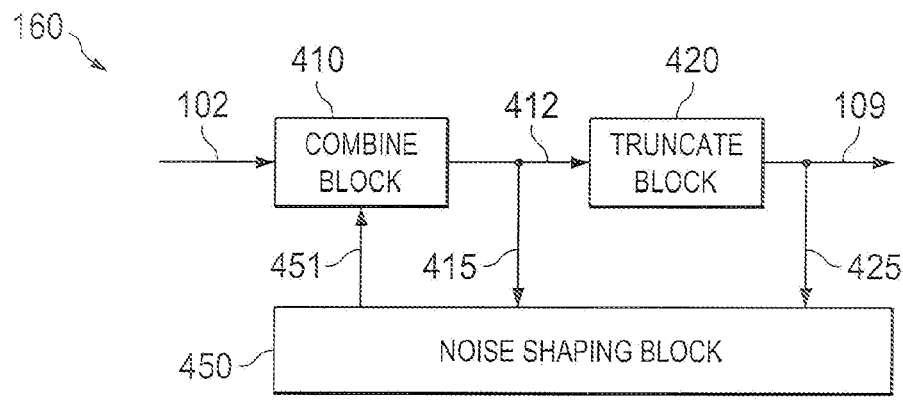
FIG. 4 is a block diagram illustrating the internal details of a processing block in an embodiment of the present invention.

FIG. 4 is a block diagram of a processing block operating to improve SNR of an ADC when using fewer bits for output codes in an embodiment of the present invention. Processing block 160 is shown containing combine block 410, truncate block 420 and noise shaping block 450. Each block is described in detail below.

Combine block 410 receives high resolution output codes (each containing H bits) on path 102, and adds a value provided by noise shaping block 450 on path 451. Combine block 410 forwards the added values to truncate block 420 on path 412, and to noise shaping block 450 on path 415. In an embodiment, each of the values on path 412/415 also contains H bits, but more bits can optionally be used.

Truncate block 420 truncates (for example, by simply dropping) each of the values received on path 412, and provides output codes with a fewer number of bits (N less than H) on path 109. Truncate block 420 also forwards each of the N-bit output codes to noise shaping block 450 on path 425. While the truncation operation is described as being performed after the addition operation, it should be appreciated that the addition operation can be performed after the truncation in alternative embodiments. Combine block 410 and truncate block 420 together represent an example output block, which generates the desired N-bit values from the H-bit values and the filtered values noted above.

Noise shaping block 450 generates the (at least some of which are non-zero) values to be added on path 451. The values can be generated using any of various approaches that will be apparent to one skilled in the relevant arts by reading the disclosure provided herein. However, by basing the values on the error signal, the SNR can be more effectively increased. The error signal can be based on the least significant (H-N) bits or computed based on the H-bit added values on path 415 and the N-bit codes on path 425.

In an embodiment, noise shaping block 450 operates on one or more such error signals (corresponding to different sampling instances), and filters the error signal to cause at least a portion of the error signal to be shifted to frequencies outside a band of interest. Noise shaping block 450 forwards values corresponding to the filtered error signal to combine block 410 on path 451. The corresponding embodiment of noise shaping block 450 is described next.

6. Noise Shaping Block

Figure 5:
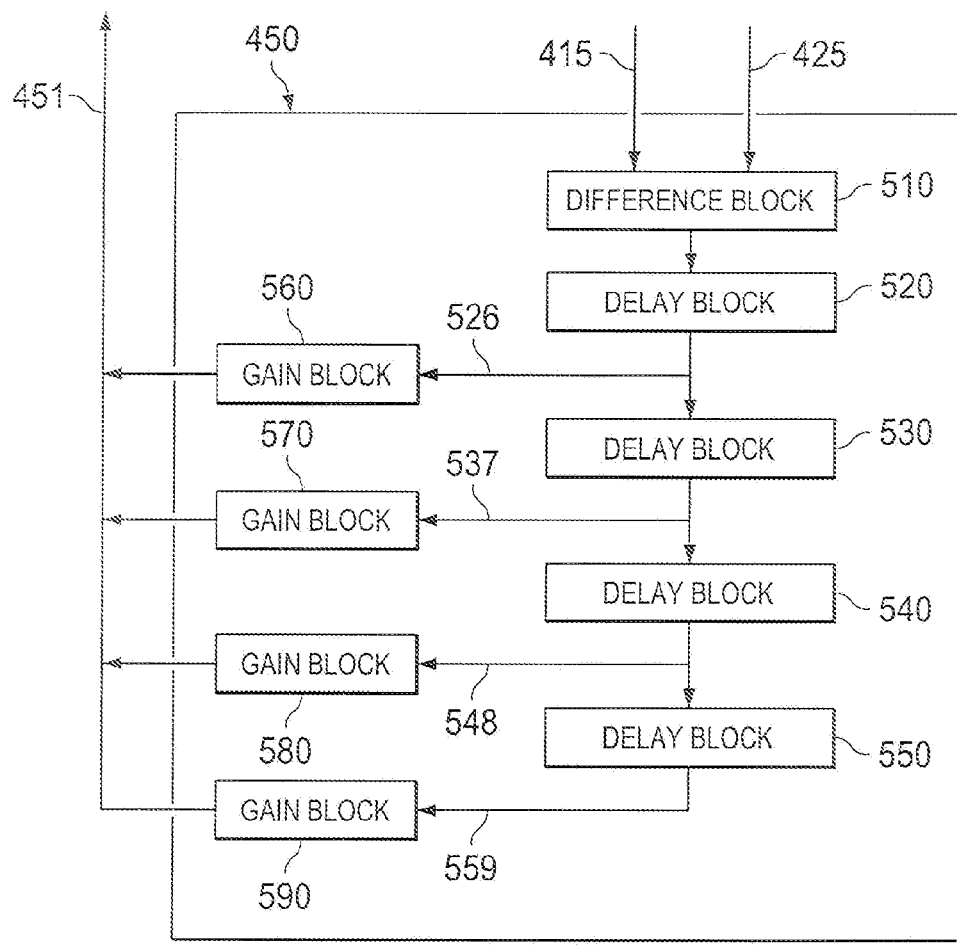
FIG. 5 is a block diagram illustrating the details of a noise-shaping block in an embodiment.

FIG. 5 is a block diagram of noise shaping block 450 in an embodiment of the present invention. Noise shaping block 450 is shown containing difference block 510, delay blocks 520, 530, 540 and 550, and gain blocks 560, 570, 580 and 590. Each block is described in detail below.

Difference block 510 receives an H-bit code on path 415 and an N-bit code (with N less than H) on path 425, and computes a difference of the two. The difference represents an error value (quantization noise) introduced by the truncation performed to generate the N-bit code from the H-bit code, as noted above. Difference block 510 generates the difference (error values) corresponding to every sampling instance. To illustrate with respect to FIG. 3, difference block 510 computes corresponding for each sampling instance, the difference of each of H-bit (6-bit in FIG. 3) codes 311-317 and the corresponding N-bit (3-bit in FIG. 3) codes. Difference block 510 forwards the error value to delay block 520.

Each of delay blocks 510, 520, 530 and 540 generates a programmable delay (but typically equal or very nearly equal to one sampling period), and provides a received error value to a next delay block and also to a corresponding gain blocks.

To illustrate with respect to FIG. 3, difference block 510 provides the difference of codes 311 and 321 (termed 'error s1)' at (or slightly later than) sampling instance s1 to delay block 520. At the next sampling instance s2, delay block 520 forwards 'error s1' to delay block 530 and on path 526 to gain block 560. Delay block 520 also receives 'error s2' at sampling instance s2.

Similarly, at the next sampling instance s3, delay block 530 forwards 'error s1' to delay block 540 and on path 537 to gain block 570. Delay block 530 also receives 'error s2' from delay block 520 at sampling instance s3, while delay block 520 also receives 'error s3' at sampling instance s3, and so on.

Each of gain blocks 560, 570, 580 and 590 provides a gain to the delayed error values received on corresponding paths, and forwards the 'gained and delayed' error values on path 451 to combine block 310 (FIG. 3) where the values are all added to the H-bit code as noted above. Each of the gains provided may be a positive or negative value. The difference block, delay blocks and gain blocks may be implemented in a known way.

A filter equation specifying the filtering operation performed by noise shaping block 450 of FIG. 4 is given below:

$$Y(z)=X(z)+E(z)\{1+a1*z^{-1}+a2*z^{-2}+a3*z^{-3}+a4*z^{-4}\} \quad \text{Equation 1}$$

wherein,

Y(z) represents the z-transform of an H-bit output code (provided on path 412) after addition of the filtered error signal (path 451), X(z) represents the z-transform of an H-bit output codes (path 102 of FIG. 4), E(z) represents the z-transform of an error signal $z^{-1}$, $z^{-2}$, $z^{-3}$ and $z^{-4}$ represent a delay operation of one, two, three and four time units respectively (where one time unit typically equals one sampling period).

a1, a2, a3 and a4 are the gains provided by gain blocks 560, 570, 580 and 590 respectively.

By selecting the values (and magnitudes) of a1, a2, a3 and a4, a user may implement the filter to have desired filter characteristics.

For example, assuming a band of frequencies from f1 to f2 represents a signal band of interest, noise shaping block 450 may be designed (by selecting the gain values in the gain blocks) to shift at least a portion of the noise components (frequencies) lying inside the band f1-f2 to frequencies outside the band f1-f2. As is well known in the relevant arts, a user typically performs zero placements (up to 4 zeros in this example of a $4^{th}$ order filter) at frequencies between f1 and f2 on a z-plane representing the filter operation specified by equation 1 above.

Figure 6:
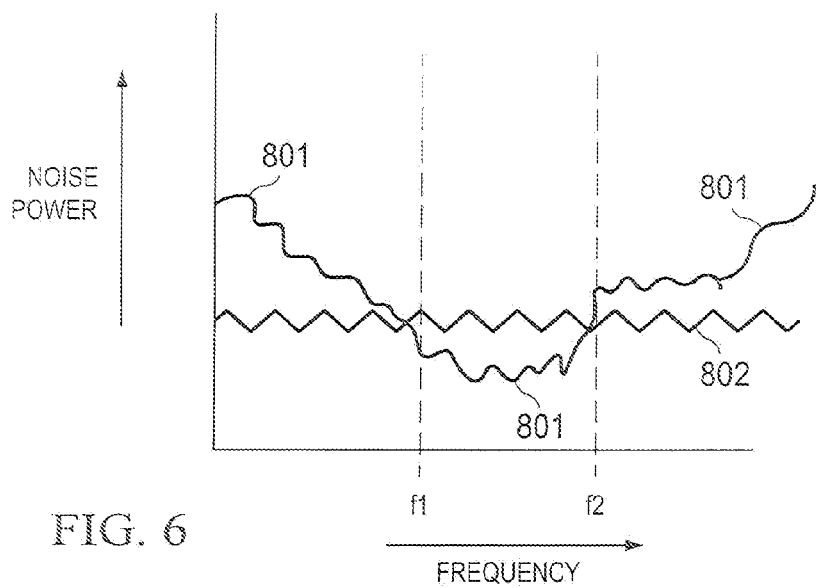
FIG. 6 is a graph showing the noise floor being reduced in a band-of-interest in an embodiment of the present invention.

Thus, the response of the filter is to reduce the strength (e.g., power, amplitude) of noise components lying within the band f1-f2 by shifting some (or portions of some) components outside the band f1-f2, as shown in FIG. 6, which illustrates the shift graphically.

In FIG. 6, jagged line 801 represents the noise floor of ADC 100 without the filtering operation noted, while jagged line 802 jagged line 802 represents the noise floor of ADC 100 with the filtering operation. It may be observed that in line 802, noise power in the band of frequencies (band of interest f1-f2) is lower than the corresponding power in 801. Since noise in the band of interest is less, SNR is improved.

While the description above is provided assuming that the points of the error signal are computed or available (as least significant bits) of the higher resolution digital codes, it should be appreciated that the same information may be available in analog form even during the conversion process. Such information in analog form also can be conveniently used, as described below with an example.

7. Example Implementation in Analog Form

Figure 7:
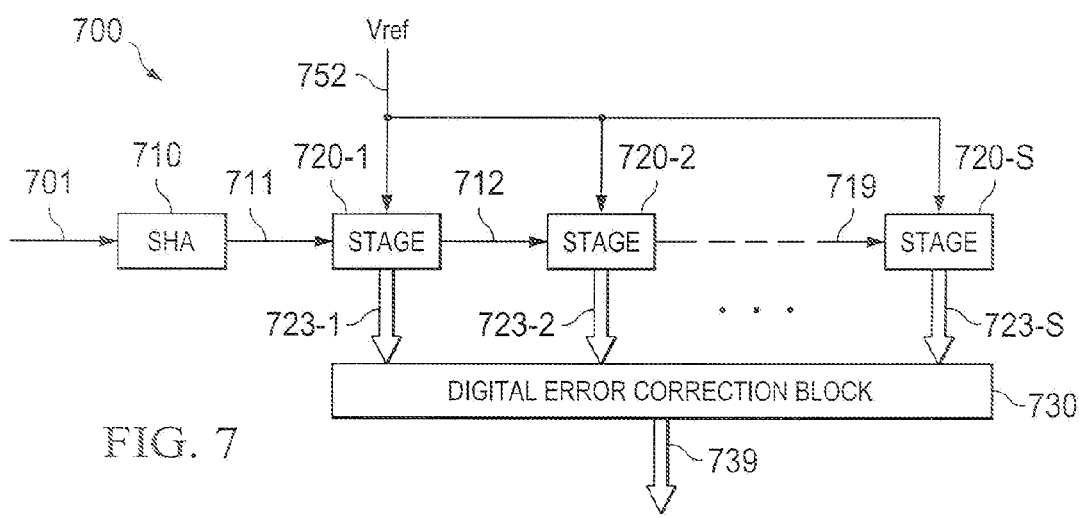
FIG. 7 is a block diagram of a pipe-line ADC in one embodiment.

FIG. 7 is a block diagram of a pipe line ADC in an embodiment of the present invention. ADC 700 is shown containing sample and hold amplifier (SHA) 710, stages 720-1 through 720-S and digital error correction block 730. Each block is described below in further detail.

SHA 710 samples the input analog signal received on path 701 and holds the voltage level of the sample on path 711 for further processing. Digital error correction block 730 receives sub-codes from various stages 720-1 through 720-S (on paths 723-1 through 723-S respectively), and generates a digital code corresponding to the sample received on path 701. Various error correction approaches, well known in the relevant arts, may be used to correct any errors in the received sub-codes. The generated digital code is provided on path 739 as a final digital code corresponding to the voltage of a sample on the input analog signal at a particular time instant.

Each stage 720-1 through 720-S generates a sub-code (based on the reference signal Vref received on path 752) corresponding to a voltage level of an analog signal received as an input, and an amplified residue signal as an input to a (any) next stage. For example, stage 720-1 converts a voltage level on path 711 to generate a sub-code on path 723-1, and the amplified residue signal generated on path 712 is provided as an input to stage 720-2. A common reference signal Vref is generally provided to stages 720-1 through 720-S.

Assuming for example that the last stage 720-S resolves the least significant (H-N) bits of the description above, analog signal on path 719 represents the error sample (or sample on the error signal). The error sample can then be used to generate the digital values on path 451 described above. As the error information is available before the entire H bit digital code is generated, additional time (compared to in FIG. 5) may be available to generate the digital values on path 451.

The ADCs thus implemented can be used in various systems/devices. The description is continued with respect to an example device.

8. Example System/Device

Figure 8:
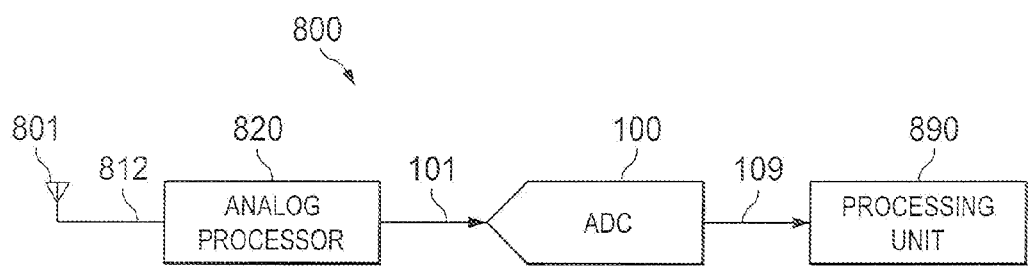
FIG. 8 is a block diagram of a system/device in an embodiment of the present invention.

FIG. 8 is a block diagram illustrating the details of an example system in which several aspects of the present invention may be implemented. Receiver system 800, which may correspond to, for example, a mobile phone is shown containing antenna 801, analog processor 820, ADC 100, and processing unit 890. Each component is described in further detail below.

Antenna 801 may receive various signals transmitted over a wireless medium. The received signals may be provided to analog processor 820 on path 812 for further processing. Analog processor 820 may perform tasks such as amplification (or attenuation as desired), filtering, frequency conversion, etc., on received signals and provides the resulting signal on path 101. The processed signal may be provided to ADC 100 on path 101.

ADC 100 converts the analog signal received on path 101 to corresponding digital values. The digital values may be provided to processing unit 890 on path 109 for further processing. ADC 100 may be implemented in a manner described above. Processing unit 890 receives the recovered data to provide various user applications (such as telephone calls, data applications).

9. Conclusion

While various embodiments of the present invention have been described above, it should be understood that they have been presented by way of example only, and not limitation. Thus, the breadth and scope of the present invention should not be limited by any of the above-described embodiments, but should be defined only in accordance with the following claims and their equivalents.

What is claimed is:

1. A method of generating a first plurality of digital values respectively representing a strength of an input signal at a corresponding plurality of time instances, each of said first plurality of digital values having not more than N-bits, wherein N represents an integer, said method being performed in an ADC (analog to digital converter), said method comprising:

sampling said input signal at said plurality of time instances to generate a second plurality of digital values, wherein each of said second plurality of digital values has more than N-bits, said second plurality of digital values containing a first digital value and a second digital value respectively representing a first sample and a second sample of said input signal and having respective values of P and Q when the least significant bits after the Nth position are ignored, wherein P and Q are also digital values; and forming said first plurality of digital values from said second plurality of digital values, wherein said first sample is provided with an integer value greater than P and said second sample is provided with an integer value less than Q in said first plurality of digital values.

2. The method of claim 1, wherein a count of said first plurality of digital values is equal to a count of said second plurality of digital values for a same portion of said input signal, wherein each of said first plurality of digital values and a corresponding one of said second plurality of digital values correspond to the same sample of said input signal.

3. The method of claim 2, wherein each of said first plurality of digital values is of N bits only and each of said second plurality of digital values is of H bits, wherein said forming comprises:

filtering an error signal representing (H-N) least significant bits of each of said second plurality of digital values to generate a sequence of filtered values, wherein each of said sequence of filtered values is based on at least some prior portion of said error signal;

adding each of said sequence of filtered values to a corresponding one of said second plurality of digital values to generate a plurality of added values; and truncating the (H-N) least significant bits of said added values to generate said first plurality of digital values.

4. The method of claim 3, wherein said filtering is designed to cause one or more frequency components of said error signal to be shifted to frequencies lying outside a desired band of interest.

5. A lower resolution analog-to-digital converter (ADC) generating a first plurality of digital values respectively representing a strength of an input signal at a corresponding plurality of time instances, each of said first plurality of digital values having not more than N-bits, wherein N represents an integer, said lower resolution ADC comprising:

a higher resolution ADC to sample said input signal at said plurality of time instances to generate a second plurality of digital values, wherein each of said second plurality of digital values has more than N-bits, said second plurality of digital values containing a first digital value and a second digital value respectively representing a first sample and a second sample of said input signal and having respective values of P and Q when the least significant bits after the Nth position are ignored; and a processing block to form said first plurality of digital values from said second plurality of digital values, wherein said first sample is provided with an integer value greater than P and said second sample is provided with an integer value less than Q in said first plurality of digital values.

6. The lower resolution ADC of claim 5, wherein a count of said first plurality of digital values is equal to a count of said second plurality of digital values for a same portion of said input signal, wherein each of said first plurality of digital values and a corresponding one of said second plurality of digital values correspond to the same sample of said input signal.

7. The lower resolution ADC of claim 6, wherein each of said first plurality of digital values is of N bits only and each of said second plurality of digital values is of H bits, wherein said processing block comprises:
   a filter block to filter an error signal representing (H-N) least significant bits of each of said second plurality of digital values to generate a sequence of filtered values, wherein each of said sequence of filtered values is based on at least some prior portion of said error signal;
   a combine block to add each of said sequence of filtered values to a corresponding one of said second plurality of digital values to generate a plurality of added values; and
   a truncation block to truncate the (H-N) least significant bits of said added values to generate said first plurality of digital values.

8. The lower resolution ADC of claim 7, wherein said filtering is designed to cause one or more frequency components of said error signal to be shifted to frequencies lying outside a desired band of interest.

9. The lower resolution ADC of claim 8, wherein said filter block is implemented as a $4^{th}$ order filter.

10. A device comprising:
   a processor processing a first plurality of digital values; and
   a lower resolution analog-to-digital converter (ADC) generating said first plurality of digital values respectively representing a strength of an input signal at a corresponding plurality of time instances, each of said first plurality of digital values having not more than N-bits, wherein N represents an integer, said lower resolution ADC comprising:
      a higher resolution ADC to sample said input signal at said plurality of time instances to generate a second plurality of digital values, wherein each of said second plurality of digital values has more than N-bits, said second plurality of digital values containing a first digital value and a second digital value respectively representing a first sample and a second sample of said input signal and having respective values of P and Q when the least significant bits after the Nth position are ignored; and
      a processing block to form said first plurality of digital values from said second plurality of digital values, wherein said first sample is provided with an integer value greater than P and said second sample is provided with an integer value less than Q in said first plurality of digital values.

11. The device of claim 10, wherein a count of said first plurality of digital values is equal to a count of said second plurality of digital values for a same portion of said input signal, wherein each of said first plurality of digital values and a corresponding one of said second plurality of digital values correspond to the same sample of said input signal.

12. The device of claim 11, wherein each of said first plurality of digital values is of N bits only and each of said second plurality of digital values is of H bits, wherein said processing block comprises:
   a filter block to filter an error signal representing (H-N) least significant bits of each of said second plurality of digital values to generate a sequence of filtered values, wherein each of said sequence of filtered values is based on at least some prior portion of said error signal;
   a combine block to add each of said sequence of filtered values to a corresponding one of said second plurality of digital values to generate a plurality of added values; and
   a truncation block to truncate the (H-N) least significant bits of said added values to generate said first plurality of digital values.

13. The device of claim 12, wherein said filtering is designed to cause one or more frequency components of said error signal to be shifted to frequencies lying outside a desired band of interest.

14. The invention of claim 11, wherein said device comprises a mobile phone and said device further comprises:
   an antenna to receive a wireless signal; and
   an analog processor to generate said input signal from said wireless signal.

15. An article of manufacture for generating a first plurality of digital values on an output path, wherein each of said first plurality of digital values respectively represents a strength of an input signal at a corresponding plurality of time instances, each of said first plurality of digital values having N-bits, wherein N represents an integer, said article comprising:
   an ADC to sample said input signal at said plurality of time instances to generate a second plurality of digital values, wherein each of said second plurality of digital values has more than N-bits, wherein an error signal represents digital values formed by the least significant bits after the Nth position in said second plurality of digital values;
   a noise shaping block to filter said error signal to generate a plurality of filtered values; and
   an output block to generate said first plurality of digital values from said second plurality of digital values and said plurality of filtered values on said output path.

16. The article of manufacture of claim 15, wherein said noise shaping block operates to cause one or more frequency components of said error signal to be shifted to frequencies lying outside a desired band of interest.

17. The article of manufacture of claim 15, wherein each of said first plurality of digital values represents a truncated value of the addition of each of said second plurality of values and the corresponding one of said plurality of filtered values.

18. The article of manufacture of claim 15, wherein said output block comprises:
   an adder adding each of said plurality of filtered values to a corresponding one of said plurality of filtered values to generate a plurality of added values; and
   a truncation block truncating each of said plurality of added values to N-bits to form said first plurality of digital values.

19. The article of manufacture of claim 15, wherein said output block comprises:
   a truncation block to truncate each of said second plurality of digital values to N-bits to form a plurality of truncated values; and
   an adder adding each of said plurality of filtered values to a corresponding one of said plurality of truncated values to form said first plurality of digital values.

20. The article of manufacture of claim 15, wherein a count of said first plurality of digital values is equal to a count of said second plurality of digital values for a same portion of said input signal, wherein each of said first plurality of digital values and a corresponding one of said second plurality of digital values correspond to the same sample of said input signal.

* * * * *